(12) United States Patent
Kim et al.

(10) Patent No.: US 11,177,814 B2
(45) Date of Patent: Nov. 16, 2021

(54) DELAY LOCKED LOOP CIRCUIT AND SEMICONDUCTOR MEMORY DEVICE HAVING THE SAME

(71) Applicant: SAMSUNG ELECTRONICS CO., LTD., Suwon-si (KR)

(72) Inventors: Hwapyong Kim, Uijeongbu-si (KR); Hundae Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/800,038

(22) Filed: Feb. 25, 2020

(65) Prior Publication Data

US 2021/0006254 A1    Jan. 7, 2021

(30) Foreign Application Priority Data

Jul. 5, 2019    (KR) ..................... 10-2019-0081148

(51) Int. Cl.
| | | |
|---|---|---|
| *H03L 7/081* | (2006.01) | |
| *G11C 7/22* | (2006.01) | |
| *G11C 8/18* | (2006.01) | |
| *H03L 7/18* | (2006.01) | |
| *G11C 7/10* | (2006.01) | |
| *H03L 7/085* | (2006.01) | |
| *G11C 8/10* | (2006.01) | |

(52) U.S. Cl.
CPC .......... *H03L 7/0818* (2013.01); *G11C 7/1057* (2013.01); *G11C 7/222* (2013.01); *G11C 8/10* (2013.01); *G11C 8/18* (2013.01); *H03L 7/085* (2013.01); *H03L 7/18* (2013.01)

(58) Field of Classification Search
CPC ......... H03L 7/0818; H03L 7/18; H03L 7/085; G11C 7/222; G11C 8/18; G11C 7/1057; G11C 8/10; G11C 7/1066; G11C 7/20; G11C 7/1093
USPC ...................................... 365/233.1
See application file for complete search history.

(56) References Cited

U.S. PATENT DOCUMENTS 6,707,759 B2    3/2004 Song
7,038,511 B2    5/2006 Kim et al.
(Continued)

FOREIGN PATENT DOCUMENTS

KR    10-2014-0029738    3/2014
KR    10-2014-0071526    6/2014
(Continued)

*Primary Examiner* — Fernando Hidalgo
(74) *Attorney, Agent, or Firm* — F. Chau & Associates, LLC

(57) ABSTRACT

A delay locked loop circuit including: a clock signal input buffer to buffer an input clock signal and generate a reference clock signal; a delay unit to delay the reference clock signal in response to a coarse and fine delay code and generate an internal clock signal; a clock signal delay replica unit to delay the internal clock signal and generate a feedback clock signal; a coarse delay control unit to receive the reference and feedback clock signals, detect a time period between a transition time point of the reference clock signal and a transition time point of the feedback clock signal occurring before the transition time point of the reference clock signal, and generate a coarse delay code; and a fine delay control unit to compare a phase of the reference clock signal and a phase of the feedback clock signal, and generate a fine delay code.

20 Claims, 11 Drawing Sheets

(56) References Cited

U.S. PATENT DOCUMENTS

| | | | |
|---|---|---|---|
| 7,622,969 B2* | 11/2009 | Johnson | H03L 7/0816 |
| | | | 327/158 |
| 8,390,347 B1* | 3/2013 | Sinha | H03L 7/089 |
| | | | 327/156 |
| 8,698,527 B2* | 4/2014 | Moon | H03L 7/0816 |
| | | | 327/149 |
| 8,749,281 B2 | 6/2014 | Seo et al. | |
| 8,766,688 B2 | 7/2014 | Choi | |
| 8,917,128 B1 | 12/2014 | Baek et al. | |
| 9,035,684 B2* | 5/2015 | Jung | H03L 7/0818 |
| | | | 327/158 |
| 9,077,350 B2 | 7/2015 | Na et al. | |
| 2004/0008566 A1 | 1/2004 | Song | |
| 2014/0002150 A1 | 1/2014 | Seo et al. | |
| 2014/0203854 A1 | 7/2014 | Jung et al. | |
| 2018/0123601 A1* | 5/2018 | Jeon | H03L 7/22 |
| 2020/0145015 A1* | 5/2020 | Im | G06F 1/04 |

FOREIGN PATENT DOCUMENTS

| | | |
|---|---|---|
| KR | 10-2014-0112663 | 9/2014 |
| KR | 10-2015-0063242 | 6/2015 |

\* cited by examiner

DELAY LOCKED LOOP CIRCUIT AND
SEMICONDUCTOR MEMORY DEVICE
HAVING THE SAME

CROSS-REFERENCE TO RELATED
APPLICATION

This application claims priority under 35 U.S.C. § 119 to Korean Patent Application No. 10-2019-0081148, filed on Jul. 5, 2019, the disclosure of which is incorporated by reference herein in its entirety.

1. TECHNICAL FIELD

The inventive concept relates to a delay locked loop circuit and a semiconductor memory device having the same.

2. DESCRIPTION OF RELATED ART

A delay locked loop circuit may generate an output clock signal locked to a phase of an input clock signal.

In general, the delay locked loop circuit includes a variable delay unit and a phase difference detector. The variable delay unit includes delay cells for variably delaying a reference clock signal generated by buffering an input clock signal according to a value of a code. The phase difference detector generates the code by detecting a phase difference between a reference clock signal and a feedback clock signal generated by replicating the output clock signal.

In some instances, however, the phase difference, which is detected by the delay locked loop circuit, may be larger than an actual phase difference. For example, there may be a malfunction of the phase difference detector.

SUMMARY

According to exemplary embodiments of the inventive concept, there is provided a delay locked loop circuit including: a clock signal input buffer configured to buffer an input clock signal and generate a reference clock signal; a delay unit configured to delay the reference clock signal in response to a coarse delay code and a fine delay code and generate an internal clock signal; a clock signal delay replica unit configured to delay the internal clock signal by a delay time of the clock signal input buffer and generate a feedback clock signal; a coarse delay control unit configured to receive the reference clock signal and the feedback clock signal, detect a time period between a transition time point of the reference clock signal and a transition time point of the feedback clock signal, and generate the coarse delay code, wherein the transition time point of the feedback clock signal occurs before the transition time point of the reference clock signal; and a fine delay control unit configured to compare a phase of the reference clock signal and a phase of the feedback clock signal, and generate the fine delay code.

According to exemplary embodiments of the inventive concept, there is provided a delay locked loop circuit including: a clock signal input buffer configured to buffer an input clock signal and generate a reference clock signal; a coarse delay unit configured to delay the reference clock signal in response to a coarse delay code; a fine delay unit configured to delay a clock signal output from the coarse delay unit in response to a fine delay code to generate an internal clock signal; a clock signal delay path unit configured to delay the internal clock signal to generate an output clock signal; a clock signal delay replica unit configured to delay the internal clock signal by a delay time to generate a feedback clock signal, wherein the delay time is obtained by adding a delay time of the clock signal delay path unit to a delay time of the clock signal input buffer; a coarse delay control unit configured to receive the reference clock signal and the feedback clock signal, detect a time period between a transition time point of the reference clock signal and a transition time point of the feedback clock signal, and generate the coarse delay code, wherein the transition time point of the feedback clock signal occurs before the transition time point of the reference clock signal; and a fine delay control unit configured to compare a phase of the reference clock signal and a phase of the feedback clock signal, and generate the fine delay code.

According to exemplary embodiments of the inventive concept, there is provided a semiconductor memory device including: a delay locked loop circuit configured to delay an external clock signal to generate an internal clock signal, and generate a feedback clock signal locked to the external clock signal; a row address decoder configured to decode a row address, and generate a plurality of word line selection signals; a column address decoder configured to decode a column address, and generate a plurality of column selection signals; a memory cell array including a plurality of memory cells, wherein the memory cell array is configured to output data stored in memory cells of the plurality of memory cells selected by the plurality of word line selection signals and the plurality of column selection signals; a data read path unit configured to receive the data output from the memory cell array and output the data in response to the internal clock signal, in response to a read command; a data output buffer configured to buffer the data output from the data read path unit and output the buffered data; and a data strobe signal buffer configured to buffer the internal clock signal and output a data strobe signal locked to the external clock signal, wherein the delay locked loop circuit comprises: a clock signal input buffer configured to buffer the external clock signal and generate a reference clock signal; a coarse delay unit configured to delay the reference clock signal in response to a coarse delay code and a fine delay code to generate an internal clock signal; a clock signal delay replica unit configured to delay the internal clock signal by a delay time to generate the feedback clock signal; a coarse delay control unit configured to receive the reference clock signal and the feedback clock signal, detect a time period between a transition time point of the reference clock signal and a transition time point of the feedback clock signal, and generate the coarse delay code, wherein the transition time point of the feedback clock signal occurs before the transition time point of the reference dock signal; and a fine delay control unit configured to compare a phase of the reference clock signal and a phase of the feedback clock signal, and generate the fine delay code.

DETAILED DESCRIPTION OF THE EMBODIMENTS

Hereinafter, a delay locked loop circuit and a semiconductor memory device having the same according to exemplary embodiments of the inventive concept will be described with reference to the accompanying drawings.

Figure 1:
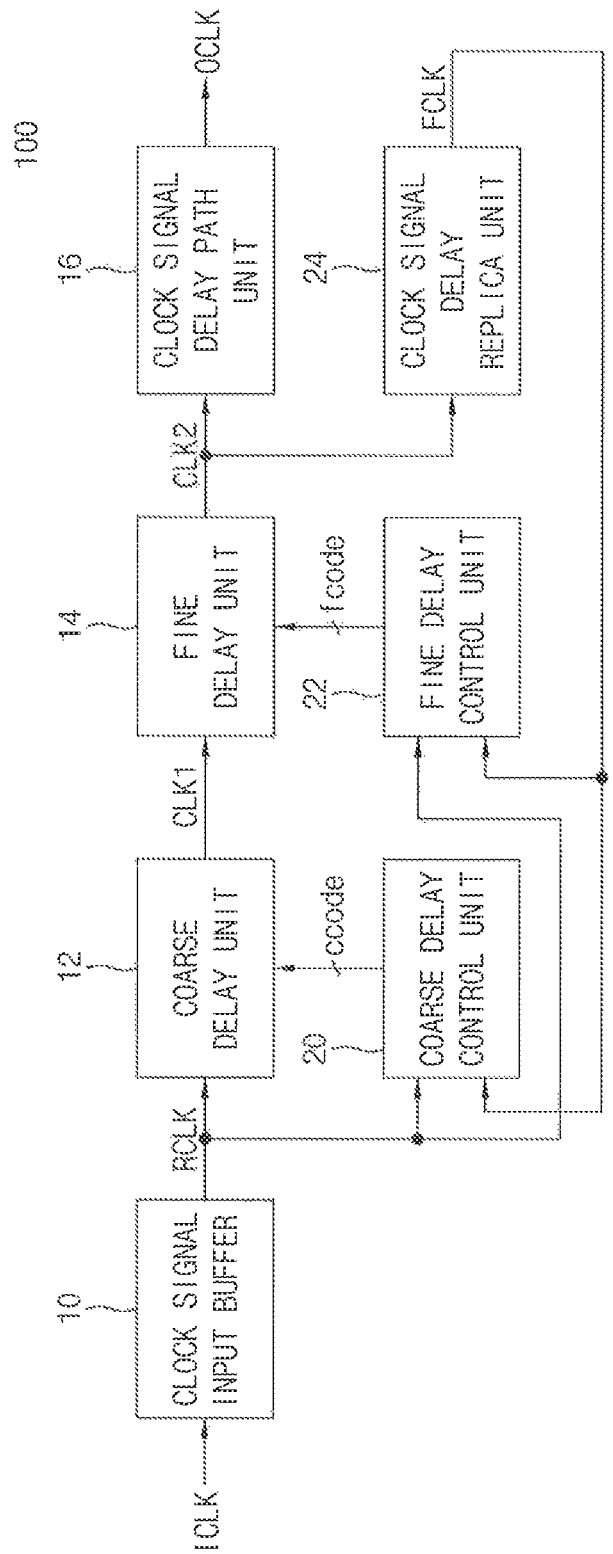
FIG. 1 is a block diagram illustrating a configuration of a delay locked loop circuit according to an exemplary embodiment of the inventive concept.

FIG. 1 is a block diagram illustrating a configuration of a delay locked loop circuit according to an exemplary embodiment of the inventive concept. The delay locked loop circuit 100 may include a clock signal input buffer 10, a coarse delay unit 12, a fine delay unit 14, a clock signal delay path unit 16, a coarse delay control unit 20, a fine delay control unit 22, and a clock signal delay replica unit 24.

A function of each of the blocks shown in FIG. 1 will be described below.

The clock signal input buffer 10 may buffer an input clock signal ICLK and generate a reference clock signal RCLK.

The coarse delay unit 12 may include a plurality of first delay cells connected in series, and a delay time of the coarse delay unit 12 may be varied in response to a coarse delay code ccode. The coarse delay unit 12 may delay the reference clock signal RCLK by the delay time of the coarse delay unit 12, and generate a first clock signal CLK1.

The fine delay unit 14 may include a plurality of second delay cells connected in series, and a delay time of the fine delay unit 14 may be varied in response to a fine delay code fcode. The fine delay unit 14 may delay the first clock signal CLK1 by the delay time of the fine delay unit 14, and generate a second clock signal CLK2.

The clock signal delay path unit 16 may be a dummy delay unit. The clock signal delay path unit 16 may delay the second clock signal CLK2 by a delay time of the clock signal delay path unit 16, and generate an output clock signal OCLK. The output clock signal OCLK may be a clock signal locked to the input clock signal ICLK.

The coarse delay control unit 20 may generate the coarse delay code ccode using the reference clock signal RCLK and a feedback clock signal FCLK. The coarse delay control unit 20 may receive the reference clock signal RCLK and the feedback clock signal FCLK, detect a time period between a transition time point of the reference clock signal RCLK and a transition time point of the feedback clock signal FCLK generated (within one clock cycle) before the transition time point of the reference clock signal RCLK, and generate the coarse delay code ccode. The transition time point of the reference clock signal RCLK may correspond to a rising or failing transition time point of the reference clock signal RCLK. The transition time point of the feedback clock signal FCLK may correspond to a rising or falling transition time point of the feedback clock signal FCLK.

The fine delay control unit 22 may compare a phase of the reference clock signal RCLK and a phase of the feedback clock signal FCLK, and generate the fine delay code fcode. The fine delay control unit 22 may perform a fine locking operation after a coarse locking operation is performed by the coarse delay control unit 20.

The clock signal delay replica unit 24 may delay the second clock signal CLK2 by a delay unit (for example, a delay time of the clock signal input buffer 10+the delay time of the clock signal delay path unit 16), and generate the feedback clock signal FCLK.

Figure 2:
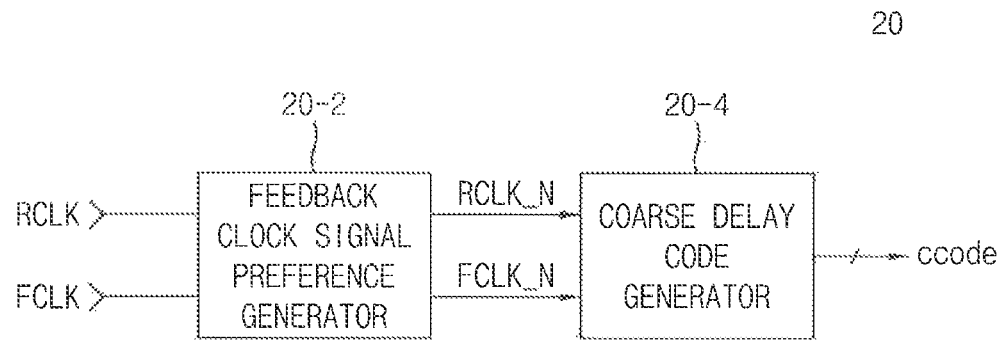
FIG. 2 is a block diagram illustrating a configuration of a coarse delay control unit according to an exemplary embodiment of the inventive concept.

FIG. 2 is a block diagram illustrating a configuration of the coarse delay control unit according to an exemplary embodiment of the inventive concept. The coarse delay control unit 20 may include a feedback clock signal preference generator 20-2, and a coarse delay code generator 20-4.

A function of the blocks shown in FIG. 2 will be described below.

The feedback clock signal preference generator 20-2 may detect the transition time point of the reference clock signal RCLK and the transition time point of the feedback clock signal FCLK (within one clock cycle) before the transition time point of the reference clock signal RCLK, and generate a frequency division reference clock signal RCLK_N and a frequency division feedback clock signal FCLK_N.

The coarse delay code generator 20-4 may detect a time period between a transition time point (e.g., a rising or falling transition time point) of the frequency division feedback clock signal FCLK_N and a transition time point (e.g., a rising or falling transition time point) of the frequency division reference clock signal RCLK_N, and generate the coarse delay code ccode.

Figure 3:
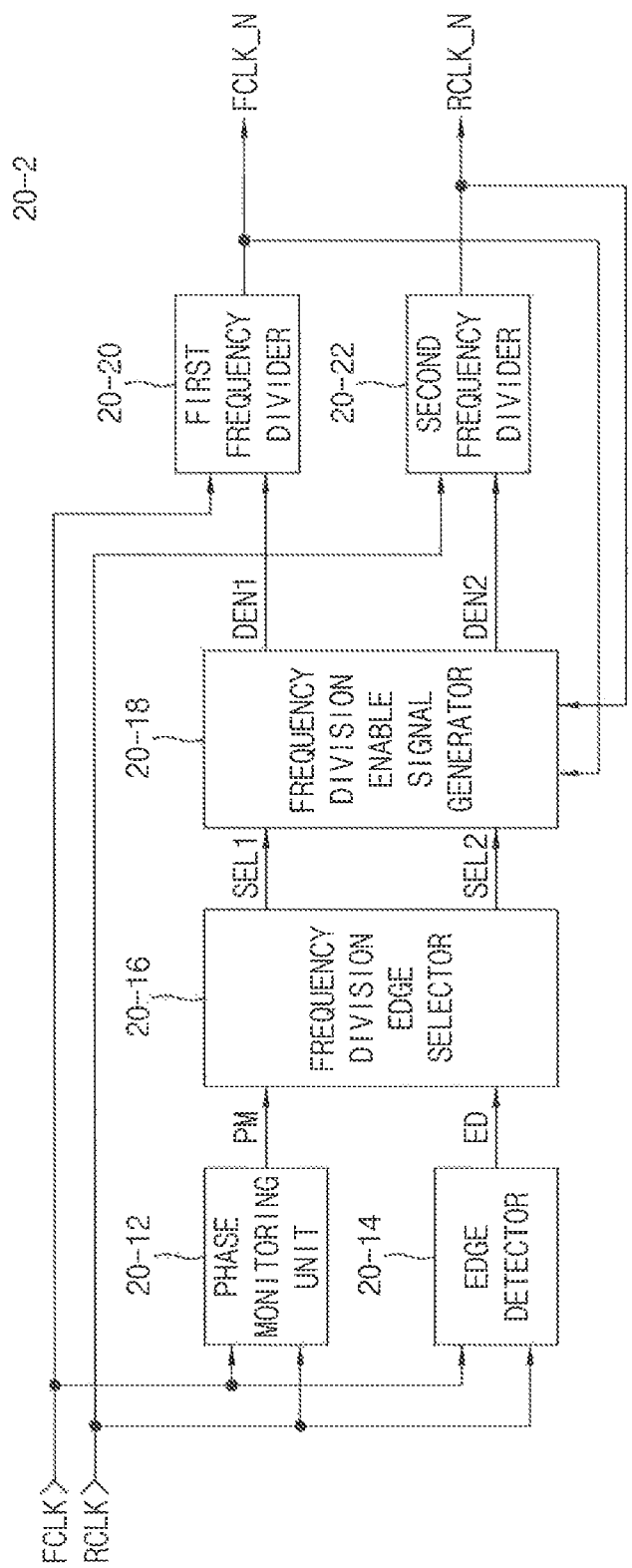
FIG. 3 is a block diagram illustrating a configuration of a feedback clock signal preference generator according to an exemplary embodiment of the inventive concept.

FIG. 3 is a block diagram illustrating a configuration of the feedback clock signal preference generator according to an exemplary embodiment of the inventive concept. The feedback dock signal preference generator 20-2 may include a phase monitoring unit 20-12, an edge detector 20-14, a frequency division edge selector 20-16, a frequency division enable signal generator 20-18, a first frequency divider 20-20, and a second frequency divider 20-22.

A function of the blocks shown in FIG. 3 will be described below.

The phase monitoring unit 20-12 may receive the reference clock signal RCLK and the feedback clock signal FCLK, and generate a phase monitoring signal PM. The phase monitoring unit 20-12 may detect a level (for example, a "high" level) of the reference clock signal RCLK at a rising transition of the feedback clock signal FCLK, and activate the phase monitoring signal PM.

The edge detector 20-14 may receive the reference dock signal RCLK and the feedback clock signal FCLK, and generate an edge detection signal ED. The edge detector 20-14 may detect a falling transition of the reference clock signal RCLK during a rising transition of the feedback clock signal FCLK, and activate the edge detection signal ED.

The frequency division edge selector 20-16 may activate a first selection signal SEL1 in response to the rising transition of the feedback clock signal FCLK and use the first selection signal SEL1 to activate a second selection signal SEL2 in response to the rising transition of the reference clock signal RCLK, when the phase monitoring signal PM or the edge detection signal ED is activated. The frequency division edge selector 20-16 may activate the first selection signal SEL1 in response to the falling transition of the feedback clock signal FCLK and use the first selection signal SEL1 to activate the second selection signal SEL2 in response to the rising transition of the reference clock signal RCLK, when both the phase monitoring signal PM and the edge detection signal ED are deactivated.

The frequency division enable signal generator 20-18 may delay the first selection signal SEL1 by a predetermined time to activate a first enable signal DEN1, and delay the second selection signal SEL2 by the predetermined time to activate a second enable signal DEN2 when the phase monitoring signal PM or the edge detection signal ED is activated. In addition, the frequency division enable signal generator 20-18 may delay the first selection signal SEL1 by the predetermined time to activate the second enable signal DEN2 when both the phase monitoring signal PM and the edge detection signal ED are deactivated. The frequency division enable signal generator 20-18 may activate the first enable signal DEN1 earlier than or at the same time point as the second enable signal DEN2.

The first frequency divider 20-20 may be enabled in response to the first enable signal DEN1, and generate the frequency division feedback clock signal FCLK_N by frequency-dividing the feedback clock signal FCLK.

The second frequency divider 20-22 may be enabled in response to the second enable signal DEN2, and generate the frequency division reference clock signal RCLK_N by frequency-dividing the reference clock signal RCLK.

In other words, the feedback clock signal preference generator 20-2 may detect the rising transition of the reference clock signal RCLK and the rising transition of the feedback clock signal FCLK generated (within one clock cycle) before the rising transition of the reference clock signal RCLK, and generate the frequency division reference clock signal RCLK_N and the frequency division feedback clock signal FCLK_N.

Figure 4:
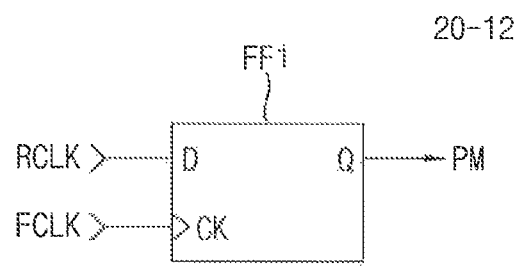
FIG. 4 is a diagram illustrating a configuration of a phase monitoring unit according to an exemplary embodiment of the inventive concept.

FIG. 4 is a diagram illustrating the phase monitoring unit according to an exemplary embodiment of the inventive concept. The phase monitoring unit 20-12 may include a first flip-flop FF1.

Referring to FIG. 4, the first flip-flop FF1 may latch the reference clock signal RCLK in response to the rising transition of the feedback clock signal FCLK. The first flip-flop FF1 may generate the phase monitoring signal PM of a "high" level when the reference clock signal RCLK is a "high" level and generate the phase monitoring signal PM of a "low" level when the reference clock signal RCLK is a "low" level, in response to the rising transition of the feedback clock signal FCLK.

Figure 5:
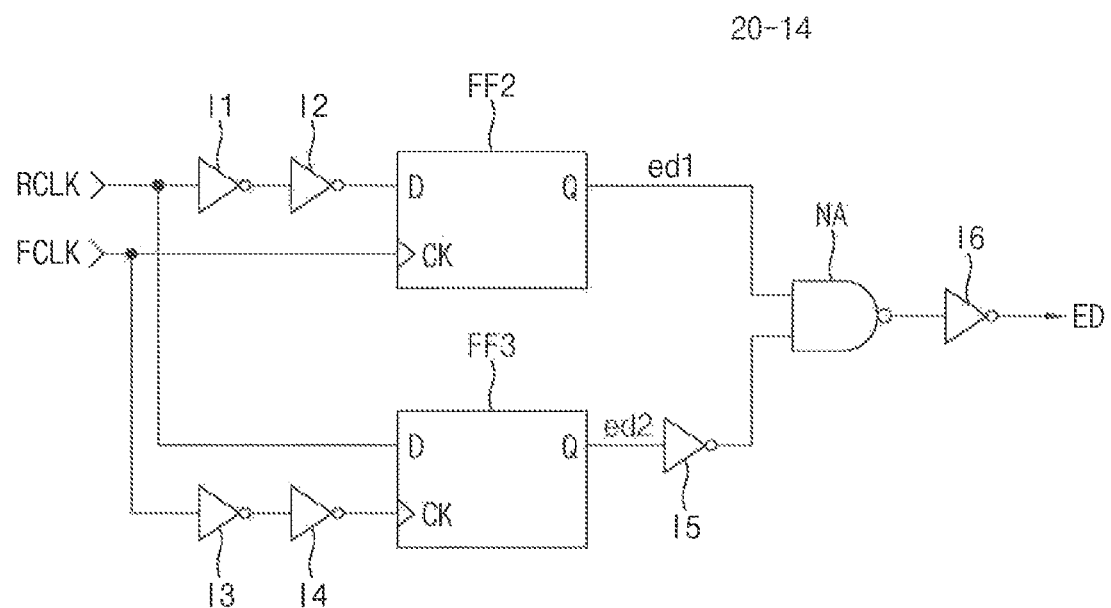
FIG. 5 is a diagram illustrating a configuration of an edge detector according to an exemplary embodiment of the inventive concept.

FIG. 5 is a diagram illustrating a configuration of the edge detector according to an exemplary embodiment of the inventive concept. The edge detector 20-14 may include second and third flip-flops FF2 and FF3, first, second, third, fourth, fifth and sixth inverters I1, I2, I3, I4, I5 and I6, and a NAND gate NA.

Referring to FIG. 5, the first and second inverters I1 and I2 may delay the reference clock signal RCLK by a first predetermined time to generate a delayed reference clock signal. The third and fourth inverters I3 and I4 may delay the feedback clock signal FCLK by a second predetermined time to generate a delayed feedback clock signal. The first predetermined time may be equal to or similar to the second predetermined time. The second flip-flop FF2 may latch the delayed reference clock signal of a "high" level in response to the rising transition of the feedback clock signal FCLK to generate a first detection signal ed1 of a "high" level. The third flip-flop FF3 may latch the reference clock signal RCLK of a "low" level in response to the rising transition of the delayed feedback clock signal to generate a second detection signal ed2 of a "low" level. The fifth inverter I5 may invert the second detection signal ed2 of the "low" level, and generate an inverted second detection signal of a "high" level. The NAND gate NA may perform a NAND operation on the first detection signal cd1 of the "high" level and the inverted second detection signal of the "high" level, and the sixth inverter I6 may invert the output of the NAND gate NA to generate the edge detection signal ED of a "high" level.

In other words, the edge detector 20-14 may detect the rising transition of the feedback clock signal FCLK during the falling transition of the reference clock signal RCLK, and generate the edge detection signal ED of the "high" level.

Figure 6:
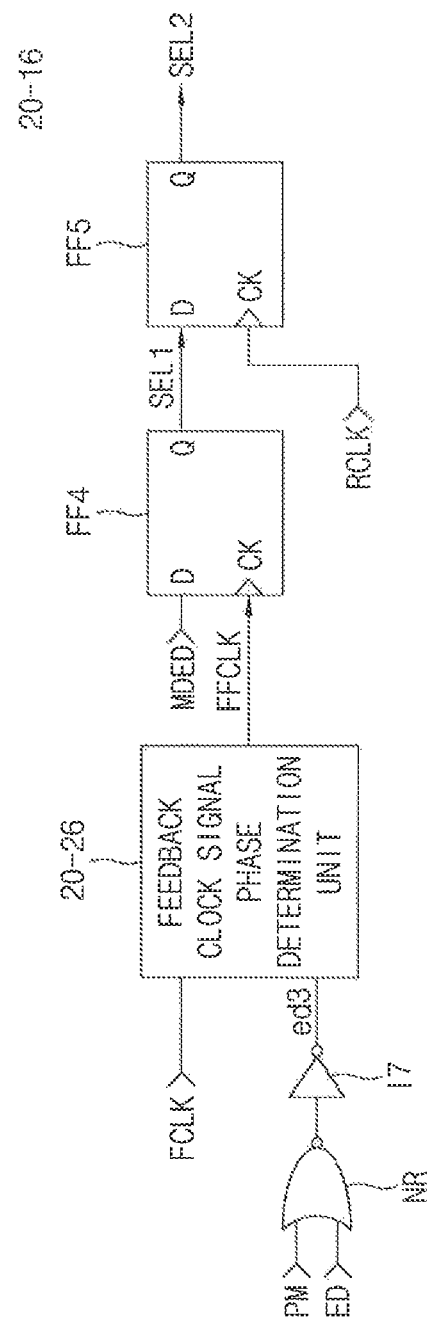
FIG. 6 is a diagram illustrating a configuration of a frequency division edge selector according to an exemplary embodiment of the inventive concept.

FIG. 6 is a diagram illustrating a configuration of the frequency division edge selector according to an exemplary embodiment of the inventive concept. The frequency division edge selector 2016 may include a NOR gate NR, a seventh inverter I7, a feedback clock signal phase determination unit 20-26, and fourth and fifth flip-flops FF4 and FF5.

Referring to FIG. 6, the NOR gate NR and the seventh inverter I7 may generate a third detection signal ed3 of a "high" level when the phase monitoring signal PM of the "high" level or the edge detection signal ED of the "high" level are received, and generate the third detection signal ed3 of a "low" level when both the phase monitoring signal PM of the "low" level and the edge detection signal ED of the "low" level are received. The feedback clock signal phase determination unit 20-26 may generate an intermediate feedback clock signal FFCLK having the same phase as the feedback clock signal FCLK in response to the third detection signal ed3 of the "high" level, and generate the intermediate feedback clock signal FFCLK having an inverted phase of the feedback clock signal FCLK in response to the third detection signal ed3 of the "low" level. The fourth flip-flop FF4 may latch a coarse locking enable signal MDED of a "high" level in response to the rising transition of the intermediate feedback clock signal FFCLK to generate the first selection signal SEL1 of a "high" level. The coarse locking enable signal MDED may be a signal which is activated to the "high" level when a coarse locking operation is performed. The fifth flip-flop FF5 may latch the first selection signal SEL1 in response to the rising transition of the reference clock signal RCLK to generate the second selection signal SEL2 of the "high" level.

In other words, the frequency division edge selector 20-16 may generate the first selection signal SEL1 of the "high" level in response to the rising transition of the feedback clock signal FCLK and generate the second selection signal SEL2 of the "high" level in response to the rising transition of the reference clock signal RCLK, when the phase monitoring signal PM of the "high" level or the edge detection signal ED of the "high" level is generated. The frequency division edge selector 20-16 may generate the first selection signal SEL1 of the "high" level in response to the falling transition of the feedback clock signal FCLK and generate the second selection signal SEL2 of the "high" level in response to the rising transition of the reference clock signal RCLK, when both the phase monitoring signal PM of the "low" level and the edge detection signal ED of the "low" level are generated.

Figure 7:
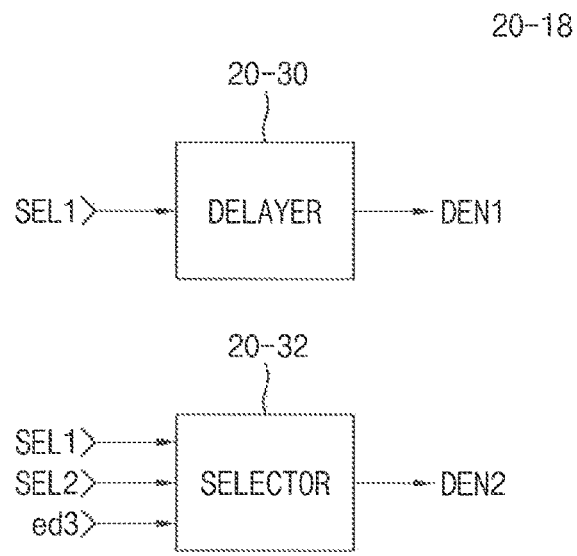
FIG. 7 is a diagram illustrating a configuration of a frequency division enable signal generator according to an exemplary embodiment of the inventive concept.

FIG. 7 is a diagram illustrating a configuration of the frequency division enable signal generator according to an exemplary embodiment of the inventive concept. The frequency division enable signal generator 20-18 may include a delayer 20-30, and a selector 20-32.

Referring to FIG. 7, the delayer 20-30 may delay the first selection signal SEL1 of the "high" level by the predetermined time to generate the first enable signal DEN1 of a "high" level. The selector 20-32 may select the second selection signal SEL2 of the "high" level to delay the second selection signal SEL2 by the predetermined time when the third detection signal ed3 of the "high" level is input thereto, and select the first selection signal SEL1 to delay the first selection signal SEL1 by the predetermined time when the third detection signal ed3 of the "low" level is input thereto, to generate the second enable signal DEN2 of a "high" level.

In other words, the frequency division enable signal generator 20-18 may receive the first selection signal SEL1 of the "high" level to generate the first enable signal DEN1 of the "high" level and receive the second selection signal SEL2 of the "high" level to generate the second enable signal DEN2 of the "high" level, when the phase monitoring signal PM of the "high" level or the edge detection signal ED of the "low" level is generated. Further, the frequency division enable signal generator 20-18 may receive the first selection signal SEL1 of the "high" level to generate the first enable signal DEN1 of the "high" level and the second enable signal DEN2 of the "high" level when both the phase monitoring signal PM of the "low" level or the edge detection signal ED of the "low" level are generated.

Figure 8:
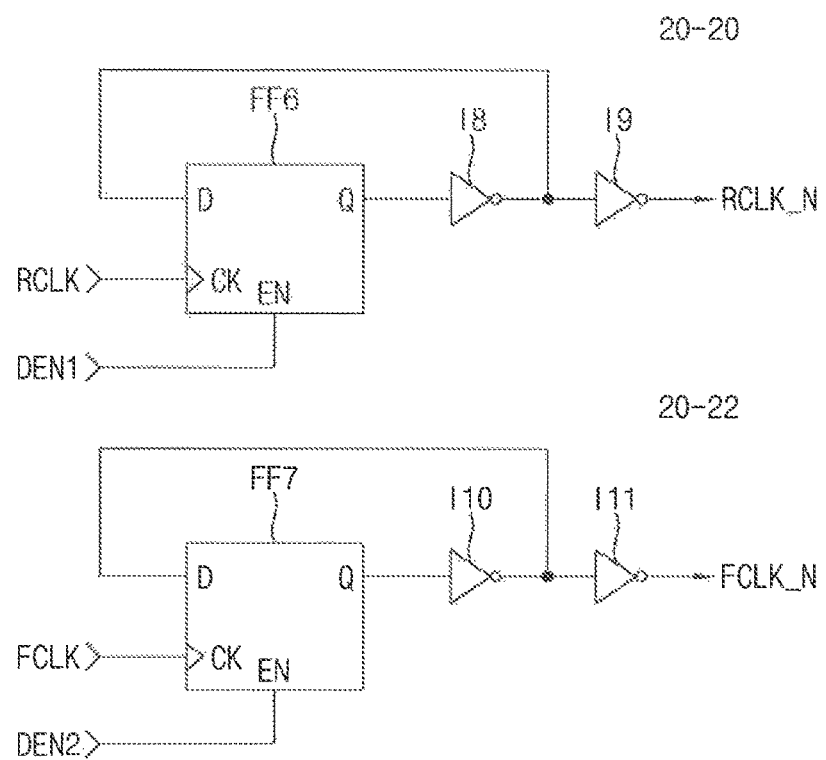
FIG. 8 is a diagram illustrating configurations of a first divider and a second divider according to an exemplary embodiment of the inventive concept.

FIG. 8 is a diagram illustrating configurations of the first frequency divider and the second frequency divider according to an exemplary embodiment of the inventive concept. The first frequency divider 20-20 may include a sixth flip-flop FF6, and eighth and ninth inverters I8 and I9, and the second frequency divider 20-22 may include a seventh flip-flop FF7, and tenth and eleventh inverters I10 and I11.

Referring to FIG. 8, the sixth flip-flop FF6 may be reset in response to the first enable signal DEN1 of the "low" level, and enabled in response to the first enable signal DEN1 of the "high" level. The seventh flip-flop FF7 may be reset in response to the second enable signal DEN2 of the "low" level, and enabled in response to the second enable signal DEN2 of the "high" level.

Referring to FIG. 8, the sixth flip-flop FF6 and the eighth and ninth inverters I8 and I9 may latch an output signal of the eighth inverter I8 in response to the rising transition of the reference dock signal RCLK to generate the frequency division reference clock signal RCLK_N. The seventh flip-flop FF7, and the tenth and eleventh inverters I10 and I11 may latch an output signal of the tenth inverter I10 in response to the rising transition of the feedback dock signal FCLK to generate the frequency division feedback clock signal FCLK_N.

Figure 9:
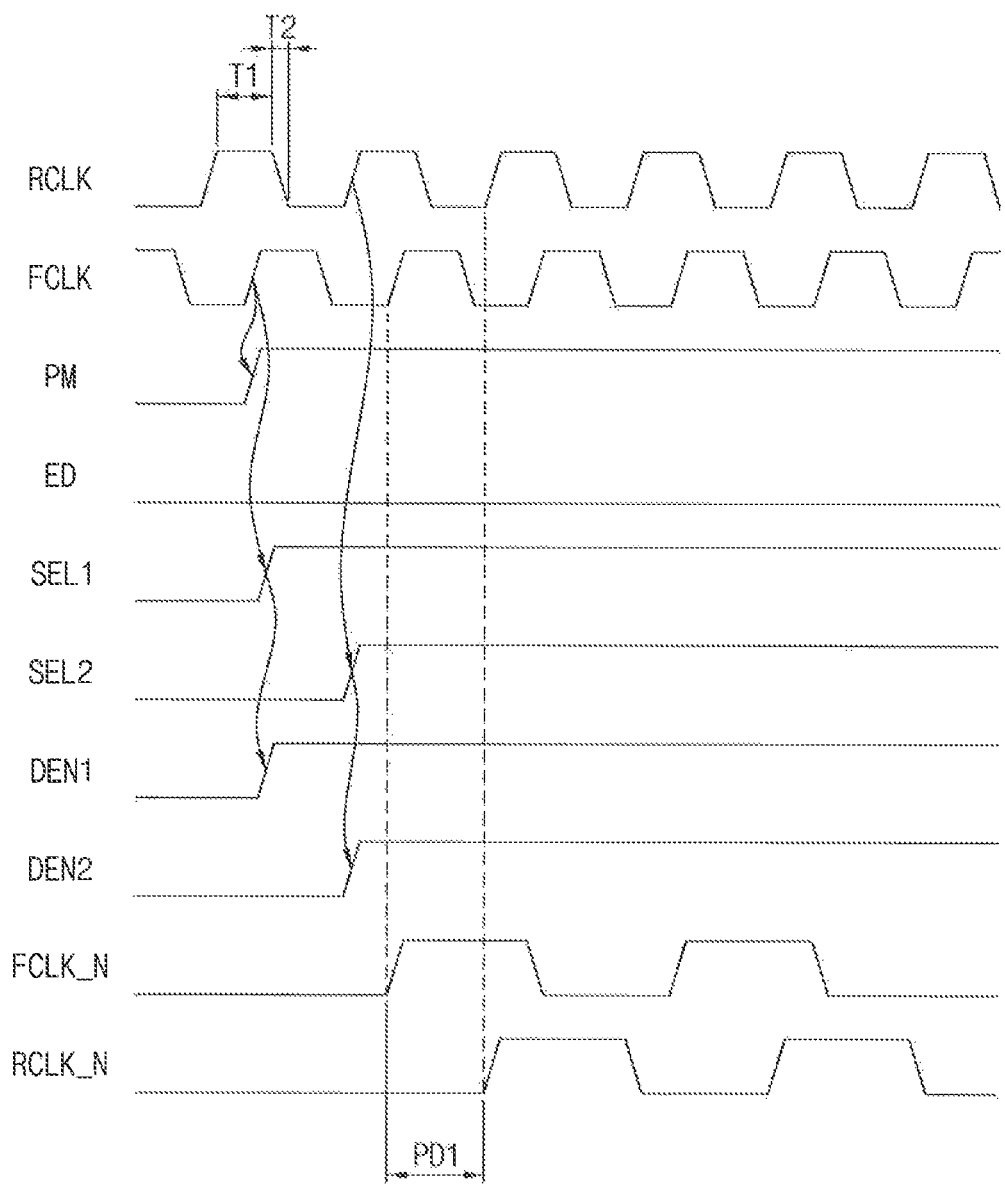
FIGS. 9, 10 and 11 are timing diagrams for describing operations of the feedback clock signal preference generator according to an exemplary embodiment of the inventive concept.

FIG. 9 is a timing diagram for describing an operation of the feedback clock signal preference generator according to an exemplary embodiment of the inventive concept. FIG. 9 is a timing diagram for describing an operation of the feedback clock signal preference generator 20-2 when the feedback clock signal FCLK transits to a "high" level during a time period T1 in which the reference clock signal RCLK is at a "high" level.

Referring to FIGS. 1 to 9, the phase monitoring unit 20-12 may latch the reference clock signal RCLK of the "high" level in response to the rising transition of the feedback dock signal FCLK to generate the phase monitoring signal PM of the "high" level. The phase monitoring unit 20-12 may activate the phase monitoring signal PM when the feedback clock signal FCLK transits to the "high" level within the time period T1 in which the reference dock signal RCLK is at the "high" level. In this case, the phase monitoring signal PM and the feedback clock signal FCLK may transition to the "high" level at the same time.

The edge detector 20-14 may generate the edge detection signal ED of the "low" level since the feedback clock signal FCLK does not transit to the "high" level within the time period T2 in which the reference clock signal RCLK transits to the "low" level.

The frequency division edge selector 20-16 may generate the first selection signal SEL1 of the "high" level in response to the rising transition of the feedback clock signal FCLK and use the first selection signal SEL1 of the "high" level in response to the rising transition of the reference clock signal RCLK to generate the second selection signal SEL2 of the "high" level, when the phase monitoring signal PM of the "high" level is generated. The second selection signal SEL2 of the "high" level is generated when the reference clock signal RCLK rises after the time period T2.

The frequency division enable signal generator 20-18 may delay the first selection signal SEL1 of the "high" level by the predetermined time to generate the first enable signal DEN1 of the "high" level, and delay the second selection signal SEL2 of the "high" level in response to the phase monitoring signal PM of the "high" level or the edge detection signal ED of the "high" level (or, the third detection signal ed3 of the "high" level) to generate the second enable signal DEN2 of the "high" level. The second enable signal DEN2 may transition to the "high" level after the first enable signal DEN1 transitions to the "high" level.

The first frequency divider 20-20 may be enabled in response to the first enable signal DEN1 of the "high" level, and generate the frequency division feedback clock signal FCLK_N by frequency-dividing the feedback clock signal FCLK.

The second frequency divider 20-22 may be enabled in response to the second enable signal DEN2 of the "high" level, and generate the frequency division reference clock signal RCLK_N by frequency-dividing the reference clock signal RCLK.

Referring to FIGS. 1 to 9, the coarse delay code generator 20-4 may detect a pulse width PD1 between the rising transition time point of the frequency division reference clock signal RCLK_N and the rising transition time point of the frequency division feedback clock signal FCLK_N, and generate the coarse delay code ccode. The pulse width PD1 may also correspond to a period between the rising transition time point of the reference clock signal RCLK and the rising time point of the feedback clock signal FCLK generated (within one clock cycle) before the rising time point of the reference clock signal RCLK.

Figure 10:
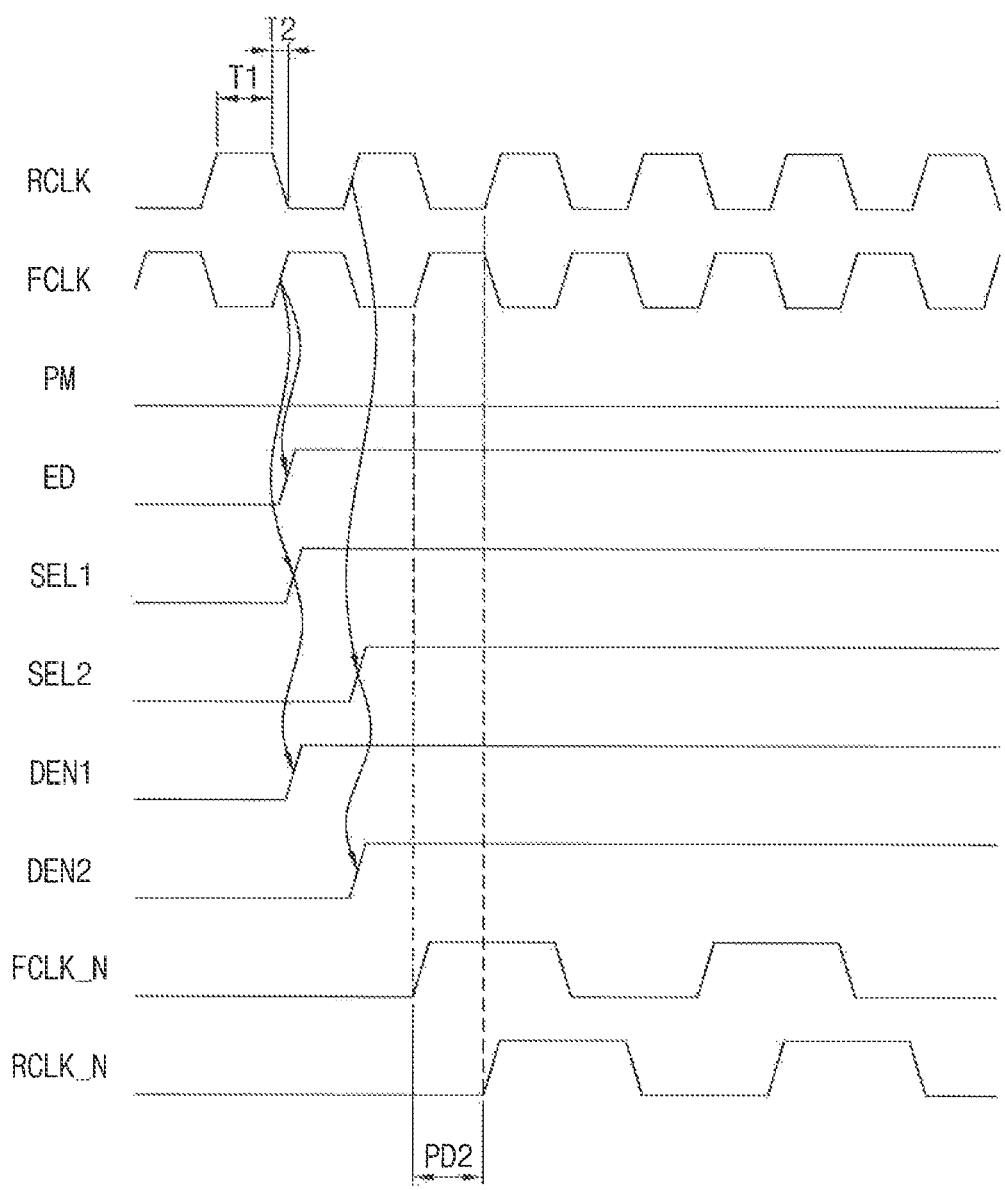

FIG. 10 is a timing diagram for describing an operation of the feedback clock signal preference generator according to an exemplary embodiment of the inventive concept. FIG. 10 is a timing diagram for describing an operation of the feedback clock signal preference generator 20-2 when the feedback clock signal FCLK transits to the "high" level during a time period T2 in which the reference clock signal RCLK transits to the "low" level".

Referring to FIGS. 1 to 8 and 10, the phase monitoring unit 20-12 may generate the phase monitoring signal PM of the "low" level since the reference clock signal RCLK is at the "low" level in response to the rising transition of the feedback clock signal FCLK.

The edge detector 20-14 may detect the rising transition of the feedback clock signal FCLK within the time period T2 in which the reference clock signal RCLK transits to the "low" level, and generate the edge detection signal ED of the "high" level.

Thereafter, the operations of the frequency division edge selector 20-16, the frequency division enable signal generator 20-18, the first frequency divider 20-2, and the second frequency divider 20-22 may be the same as those described above with reference to FIG. 9.

Referring to FIGS. 1 to 8 and 10, the coarse delay code generator 20-4 may detect a pulse width PD2 between the rising transition time point of the frequency division reference clock signal RCLK_N and the rising transition time point of the frequency division feedback clock signal FCLK_N, and generate the coarse delay code ccode. The pulse width PD1 may be wider than the pulse width PD2.

Figure 11:
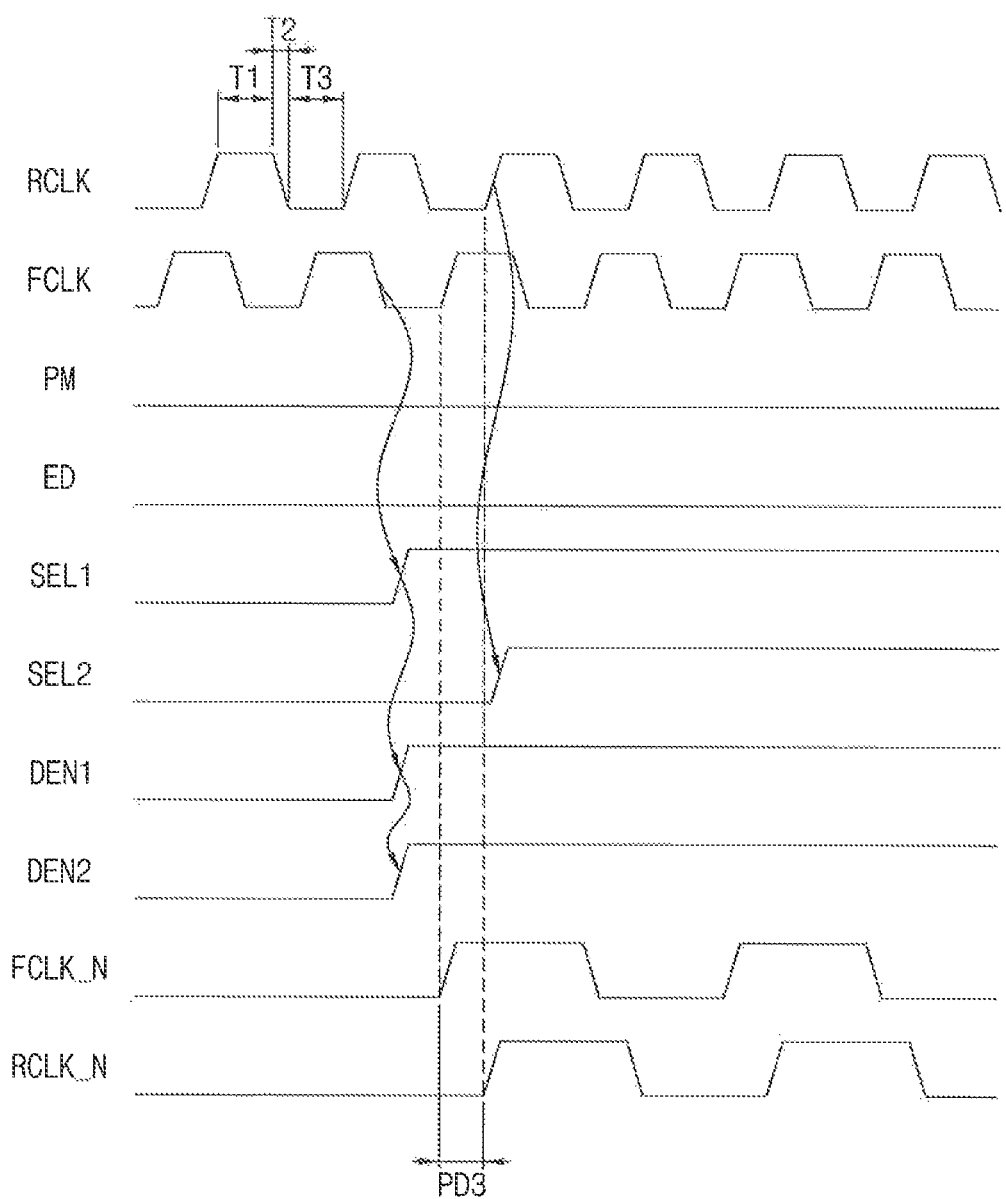

FIG. 11 is a timing diagram for describing an operation of the feedback clock signal preference generator according to an exemplary embodiment of the inventive concept. FIG. 11 is a timing diagram for describing an operation of the feedback dock signal preference generator 20-2 when the feedback clock signal. FCLK transits to the "high" level during a time period T3 in which the reference clock signal RCLK is at the "low" level".

Referring to FIGS. 1 to 8 and 11, the phase monitoring unit 20-12 may latch the reference clock signal RCLK of the "low" level in response to the rising transition of the feedback clock signal FCLK to generate the phase monitoring signal PM of the "low" level.

The edge detector 20-14 may generate the edge detection signal ED of the "low" level since the feedback clock signal FCLK does not transit to the "high" level" within the time period T2 in which the reference clock signal RCLK transits to the "low" level.

The frequency division edge selector 20-16 may generate the first selection signal SEL1 of the "high" level in response to the falling transition of the feedback clock signal FCLK and use the first selection signal SEL1 of the "high" level in response to the rising transition of the reference clock signal RCLK to generate the second selection signal SEL2 of the "high" level, when the phase monitoring signal PM of the "low" level and the edge detection signal ED of the "low" level are generated.

The frequency division enable signal generator 20-18 may delay the first selection signal SEL1 of the "high" level by the predetermined time to generate the first enable signal DEN1 of the "high" level, and delay the first selection signal SEL1 of the "high" level by the predetermined time in response to both the phase monitoring signal PM of the "low" level or the edge detection signal ED of the "low" level (or, the third detection signal ed3 of the "low" level) to generate the second enable signal DEN2 of the "high" level.

Operations of the first frequency divider 20-20 and the second frequency divider 20-22 may be the same as those described above with reference to FIG. 9.

Referring to FIGS. 2 and 11, the coarse delay code generator 20-4 may detect a pulse width PD3 between the rising transition time point of the frequency division reference clock signal RCLK_N and the rising transition time point of the frequency division feedback clock signal FCLK_N, and generate the coarse delay code ccode. The pulse width PD3 may be narrower than the pulse width PD2.

Referring to FIGS. 1 to 11, the feedback clock signal preference generator 20-2 may detect the rising transition time point of the reference clock signal RCLK and the rising transition time point of the feedback clock signal FCLK generated (within one clock cycle) before the rising transition time point of the reference clock signal and generate the frequency division reference clock signal RCLK_N and the frequency division feedback clock signal FCLK_N. Accordingly, the coarse delay code generator 20-4 may accurately detect a time period between the rising transition time point of the reference clock signal RCLK and the rising transition time point of the feedback clock signal FCLK.

Figure 12:
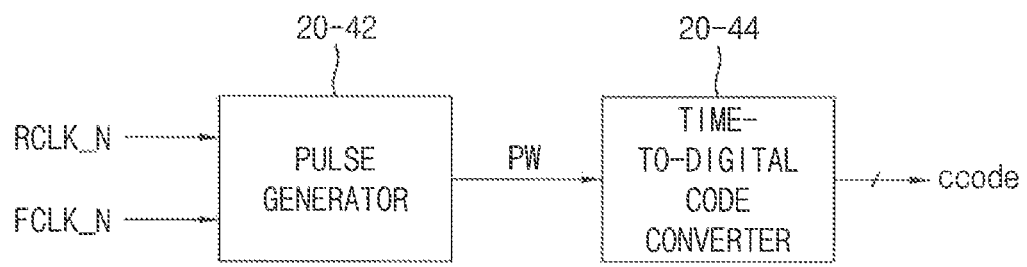
FIG. 12 is a block diagram illustrating a configuration of a coarse delay code generator according to an exemplary embodiment of the inventive concept.

FIG. 12 is a block diagram illustrating a configuration of the coarse delay code generator according to an exemplary embodiment of the inventive concept. The coarse delay code generator 20-4 may include a pulse generator 20-42, and a time-to-digital code converter 20-44.

Referring to FIG. 12, the pulse generator 20-42 may detect a time period between the rising transition time point of the frequency division reference clock signal and the rising transition time point of the frequency division feedback clock signal FCLK_N to generate a pulse signal PW. Referring to FIGS. 9 to 12, the pulse generator 20-42 may generate the pulse signal PW having the pulse width PD1, PD2, car PD3 between the rising transition time point of the frequency division reference clock signal RCLK_N and the rising transition time point of the frequency division feedback clock signal FCLK_N.

Referring to FIG. 12, the time-to-digital code converter 20-44 may convert a time period corresponding to the pulse width of the pulse signal PW into a digital code, and generate the coarse delay code ccode.

Figure 13:
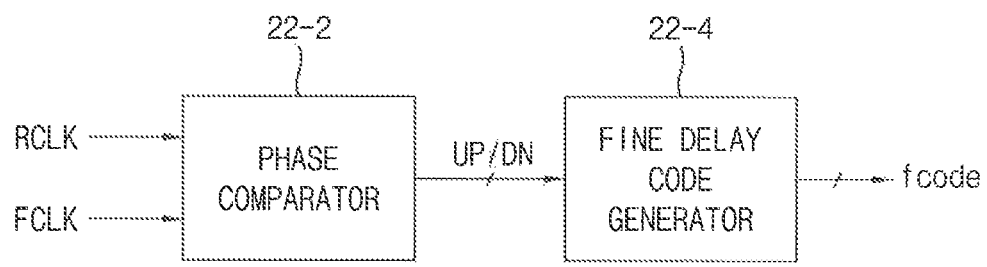
FIG. 13 is a block diagram illustrating a configuration of a fine delay control unit according to an exemplary embodiment of the inventive concept.

FIG. 13 is a block diagram illustrating a configuration of the fine delay control unit according to an exemplary embodiment of the inventive concept. The fine delay control unit 22 may include a phase comparator 22-2, and a fine delay code generator 22-4.

Referring to FIG. 13, the phase comparator 22-2 may compare phases of the reference clock signal RCLK and the feedback clock signal FCLK and generate an up signal UP or a down signal DN according to a comparison result, after the coarse locking operation is performed. The fine delay code generator 22-4 may perform a counting operation based on the up signal UP or the down signal DN, and generate a fine delay code fcode.

Figure 14:
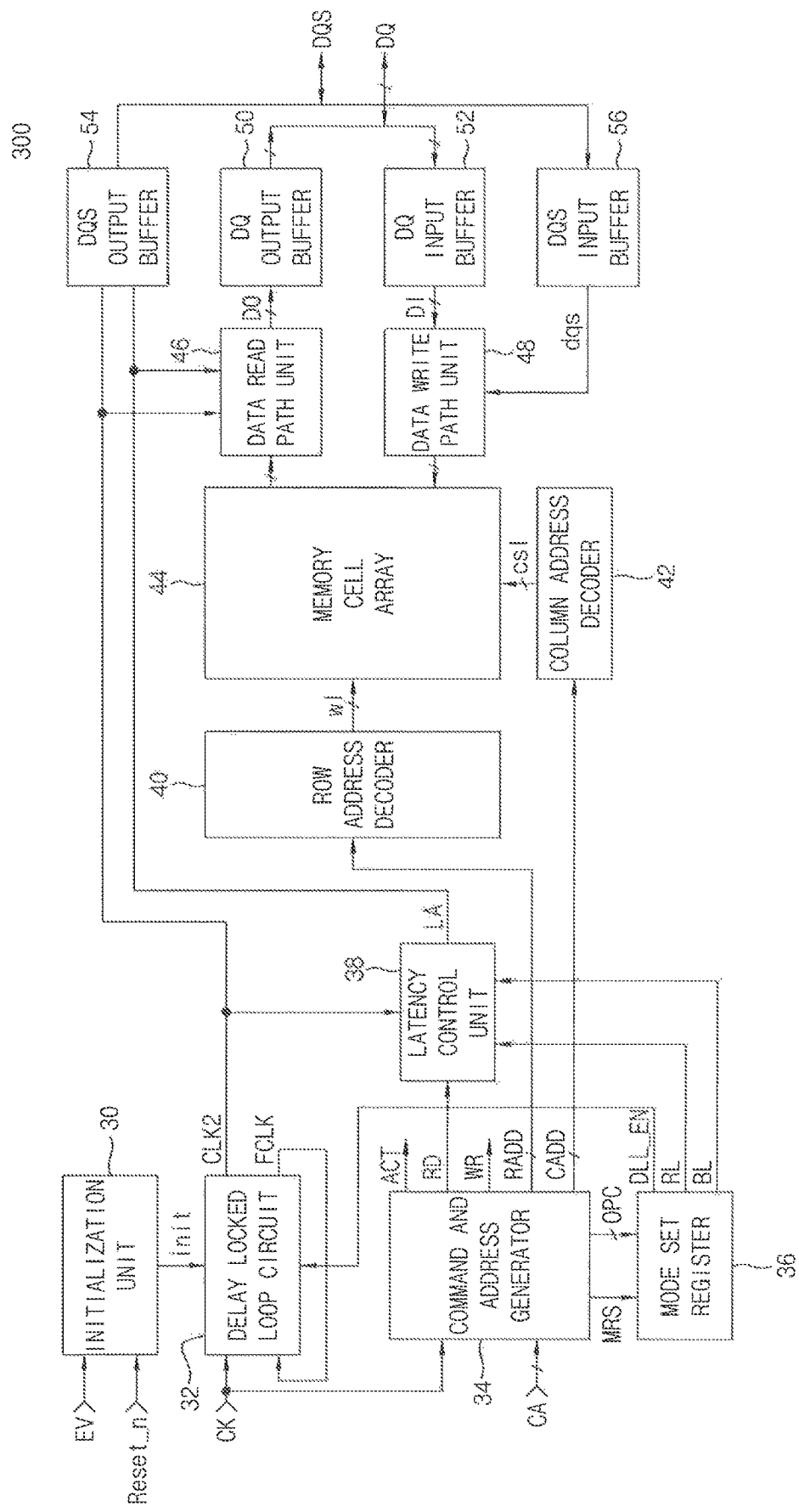
FIG. 14 is a block diagram illustrating a semiconductor memory device according to an exemplary embodiment of the inventive concept.

FIG. 14 is a block diagram illustrating a configuration of a semiconductor memory device according to an exemplary embodiment of the inventive concept. The semiconductor memory device 300 may include an initialization unit 30, a delay locked loop circuit 32, a command and address generator 34, a mode set register 36, a latency control unit 38, a row address decoder 40, a column address decoder 42, a memory cell array 44, a data read path unit 46, a data write path unit 48, a data (DQ) output buffer 50, a DQ input buffer 52, a data strobe signal (DQS) output buffer 54, and a DQS input buffer 56.

A function of the blocks shown in FIG. 14 will be described below.

The initialization unit 30 may generate an initialization signal init when a reset signal Reset_n transiting to a "high" level from the outside is applied after an external power supply voltage EV applied from the outside reaches a target voltage level.

The delay locked loop circuit 32 may perform the coarse locking operation and the fine locking operation in response to the initialization signal init and a delay locked loop enable signal DLL_EN, and generate the feedback clock signal FCLK locked to the external clock signal CK applied from the outside. The delay locked loop circuit 32 may perform the coarse locking operation and the fine locking operation whenever the delay locked loop enable signal DLL_EN is generated regardless of the initialization signal init. The delay locked loop circuit 32 may have the same configuration and operation as that described above with reference to FIGS. 1 to 13. The external clock signal CK may be the input clock signal ICLK shown in FIG. 1, and the data strobe signal DQS may be the output clock signal OCLK shown in FIG. 1. The clock signal delay replica unit 24 shown in FIG. 1 may delay the feedback clock signal FCLK by the delay time of the clock signal input buffer 10 shown in FIG. 1 by a delay time of the DQS output buffer 54.

The command and address generator 34 may decode a command and address CA in response to the clock signal CK, and generate a mode set command MRS, an active command ACT, a read command RD, and a write command WR. Further, the command and address generator 34 may generate an address signal included in the command and address CA as a mode set code OPC in response to the mode set command MRS, generate the address signal included in the command and address CA as a row address RADD in response to the active command ACT, and generate the address signal included in the command and address CA as a column address CADD in response to the read command RD or the write command WR.

The mode set register 36 may store the mode set code OPC in response to the mode set command MRS, and set the delay locked loop enable signal DLL_EN, a read latency RL, and a burst length BL. The mode set register 36 may receive the mode set code OPC, and activate the delay locked loop enable signal DLL_EN.

The latency control unit 38 may generate a latency signal LA which is activated after delaying the read command RD by the number of clock cycles corresponding to a value of the read latency RL and deactivated after delaying the read command RD by the number of clock cycles corresponding to the value of the read latency RL plus the number of clock cycles corresponding to a value of the burst length BL using the second clock signal CLK2 when the read command RD is applied. The latency control unit 38 may generate the latency signal LA which is activated when data DQ is output through the DQ output buffer 50 using the second clock signal CLK2, the read latency RL, and the burst length BL in response to the read command RD.

The row address decoder 40 may decode the row address RADD, and generate a plurality of word line selection signals w1.

The column address decoder 42 may decode the column address CADD, and generate a plurality of column selection signals cs1.

The memory cell array 44 may include a plurality of memory cells connected between a plurality of word lines selected by the plurality of word line selection signals w1 and a plurality of bit lines selected by the plurality of column selection signals cs1. The memory cell array 44 may output data from memory cells selected by the plurality of word line selection signals w1 and the plurality of column selection signals es1 in response to the read command RD, and input data to the memory cells selected by the plurality of word line selection signals w1 and the plurality of column selection signal cs1 in response to the write command WR.

The data read path unit 46 may latch the data output from the memory cell array 44, and output data DO in response to the second clock signal CLK2 during an activation time period of the latency signal LA.

The data write path unit 48 may latch data DI in an internal data strobe signal dqs, and output data to the memory cell array 44.

The DQ output buffer 50 may buffer the data DO, and generate data DQ.

The DQ input buffer 52 may buffer the data DQ applied from the outside, and generate the data DI.

The DQS output buffer 54 may buffer the second clock signal CLK2 during the activation time period of the latency signal LA, and generate a data strobe signal DQS locked to the external clock signal CK.

The DQS input buffer 56 may buffer a data strobe signal DQS applied from the outside, and generate an internal data strobe signal dqs.

In the exemplary embodiments described above, events that occur at the rising transition of the reference clock signal RCLK and the rising transition of the feedback clock signal FCLK may occur at the falling transition of the reference clock signal RCLK and the falling transition of the feedback clock signal FCLK. In addition, events that occur at the falling transition of the reference clock signal RCLK and the falling transition of the feedback clock signal FCLK may occur at the rising transition of the reference clock signal RCLK and the rising transition of the feedback clock signal FCLK.

The delay locked loop circuit according to the above-described exemplary embodiments of the inventive concept can accurately detect the time period between the transition time point of the reference clock signal and the transition time point of the feedback clock signal by detecting the transition time point of the feedback transition time point generated (within one clock cycle) before the transition time point of the reference clock signal to generate the coarse delay code.

Accordingly, the delay locked loop circuit and the semiconductor memory device having the same according to exemplary embodiments of the inventive concept can increase the reliability of the operation of the semiconductor memory device.

While the inventive concept has been particularly shown and described with reference to exemplary embodiments thereof, it should be understood by those skilled in the art that various modifications may be made thereto without departing from the scope of the inventive concept as set forth by the following claims.

What is claimed is:

1. A delay locked loop circuit, comprising:
   a clock signal input buffer configured to buffer an input clock signal and generate a reference clock signal;
   a delay unit configured to delay the reference clock signal in response to a coarse delay code and a fine delay code and generate an internal clock signal;
   a clock signal delay replica unit configured to delay the internal clock signal by a delay time of the clock signal input buffer and generate a feedback clock signal;
   a coarse delay control unit configured to receive the reference clock signal and the feedback clock signal, detect a transition of the reference clock signal and a transition of the feedback clock signal generated within one clock cycle before the transition of the reference clock signal to generate a frequency division reference clock signal and a frequency division feedback clock signal, and detect a time period between a transition time point of the frequency division reference clock signal and a transition time point of the frequency division feedback clock signal to generate the coarse delay code; and a fine delay control unit configured to compare a phase of the reference clock signal and a phase of the feedback clock signal, and generate the fine delay code.

2. The delay locked loop circuit of claim 1, further comprising:

a clock signal delay path unit configured to delay the internal clock signal and generate an output clock signal, wherein the clock signal delay replica unit further delays the internal clock signal by a delay time of the clock signal delay path unit and generates the feedback clock signal.

3. The delay locked loop circuit of claim 2, wherein the coarse delay control unit comprises:

a feedback clock signal preference generator configured to detect the transition time point of the reference clock signal and a transition time point of the feedback clock signal, and generate the frequency division reference clock signal and the frequency division feedback clock signal; and a coarse delay code generator configured to detect the time period between the transition time point of the frequency division feedback clock signal and the transition time point of the frequency division reference clock signal, and generate the coarse delay code corresponding to the time period.

4. The delay locked loop circuit of claim 3, wherein the feedback clock signal preference generator comprises:

a phase monitoring unit configured to detect a level of the reference clock signal at a rising transition of the feedback clock signal to activate a phase monitoring signal;

an edge detector configured to detect a falling transition of the reference clock signal at the rising transition of the feedback clock signal to activate an edge detection signal;

a frequency division edge selector configured to activate a first selection signal in response to the rising transition of the feedback clock signal and use the first selection signal to activate a second selection signal in response to a rising transition of the reference clock signal when the phase monitoring signal or the edge detection signal is activated, and activate the first selection signal in response to a falling transition of the feedback clock signal and use the first selection signal to activate the second selection signal in response to the rising transition of the reference clock signal when the phase monitoring signal and the edge detection signal are deactivated;

a frequency division enable signal generator configured to delay the first selection signal by a first time to generate a first enable signal, and delay the second selection signal by the first time when the phase monitoring signal or the edge detection signal is activated and delay the first selection signal by the first time to generate a second enable signal when the phase monitoring signal and the edge detection signal are deactivated;

a first frequency divider configured to be enabled in response to the first enable signal, and generate the frequency division feedback clock signal by frequency-dividing the feedback clock signal; and a second frequency divider configured to be enabled in response to the second enable signal, and generate the frequency division reference clock signal by frequency-dividing the reference clock signal.

5. The delay locked loop circuit of claim 4, wherein the phase monitoring unit comprises:

a first flip-flop configured to receive the reference clock signal in response to the rising transition of the feedback clock signal to generate the phase monitoring signal, wherein the edge detector comprises;

a first delayer configured to delay the reference clock signal and generate a delayed reference clock signal;

a second delayer configured to delay the feedback clock signal and generate a delayed feedback clock signal;

a second flip-flop configured to receive the delayed reference clock signal in response to the feedback clock signal to generate a first detection signal;

a third flip-flop configured to receive the reference clock signal in response to the delayed feedback clock signal to generate a second detection signal;

a first inverter configured to invert the second detection signal to generate an inverted second detection signal;

a NAND gate configured to perform a NAND operation on the first detection signal and the inverted second detection signal; and a second inverter configured to invert an output signal of the NAND gate to generate the edge detection signal.

6. The delay locked loop circuit of claim 4, wherein the frequency division edge selector comprises:

a NOR gate configured to perform a NOR operation on the phase monitoring signal and the edge detection signal;

an inverter configured to invert an output signal of the NOR gate to generate a third detection signal;

a feedback clock signal phase determination unit configured to generate an intermediate feedback clock signal having the same phase as or an inverted phase of the feedback clock signal in response to the third detection signal;

a fourth flip-flop configured to latch a coarse locking enable signal in response to the intermediate feedback clock signal to generate the first selection signal; and a fifth flip-flop configured to latch the first selection signal in response to the reference clock signal to generate the second selection signal.

7. The delay locked loop circuit of claim 6, wherein the frequency division enable signal generator comprises:

a delayer configured to receive the first selection signal, delay the first selection signal by the first time, and generate the first enable signal; and a selector configured to select the first selection signal or the second selection signal, delay the selected first selection signal or the selected second selection signal by the first time, and generate the second enable signal.

8. A delay locked loop circuit, comprising:

a clock signal input buffer configured to buffer an input clock signal and generate a reference clock signal;

a coarse delay unit configured to delay the reference clock signal in response to a coarse delay code;

a fine delay unit configured to delay a clock signal output from the coarse delay unit in response to a fine delay code to generate an internal clock signal;

a clock signal delay path unit configured to delay the internal clock signal to generate an output clock signal;

a clock signal delay replica unit configured to delay the internal clock signal by a delay time to generate a feedback clock signal, wherein the delay time is obtained by adding a delay time of the clock signal delay path unit to a delay time of the clock signal input buffer;

a coarse delay control unit configured to receive the reference clock signal and the feedback clock signal, detect a transition of the reference clock signal and a transition of the feedback clock signal generated within one clock cycle before the transition of the reference clock signal to generate a frequency division reference clock signal and a frequency division feedback clock signal, and detect a time period between a transition time point of the frequency division reference clock signal and a transition time point of the frequency division feedback clock signal to generate the coarse delay code; and a fine delay control unit configured to compare a phase of the reference clock signal and a phase of the feedback clock signal, and generate the fine delay code.

9. The delay locked loop circuit of claim 8, wherein the coarse delay control unit comprises:

a feedback clock signal preference generator configured to detect a transition time point of the reference clock signal and a transition time point of the feedback clock signal, and generate the frequency division reference clock signal and the frequency division feedback clock signal; and a coarse delay code generator configured to detect the time period between the transition time point of the frequency division feedback clock signal and the transition time point of the frequency division reference clock signal, and generate the coarse delay code corresponding to the time period.

10. The delay locked loop circuit of claim 9, wherein the feedback clock signal preference generator comprises:

a phase monitoring unit configured to detect a level of the reference clock signal at a rising transition of the feedback clock signal to activate a phase monitoring signal;

an edge detector configured to detect a falling transition of the reference clock signal during the rising transition of the feedback clock signal to activate an edge detection signal;

a frequency division edge selector configured to activate a first selection signal in response to the rising transition of the feedback clock signal and use the first selection signal to activate a second selection signal in response to a rising transition of the reference clock signal when the phase monitoring signal or the edge detection signal is activated, and activate the first selection signal in response to the falling transition of the feedback clock signal, and use the first selection signal to activate the second selection signal in response to the rising transition of the reference clock signal when the phase monitoring signal and the edge detection signal are deactivated;

a frequency division enable signal generator configured to delay the first selection signal by a predetermined time to generate a first enable signal, and delay the second selection signal by the predetermined time when the phase monitoring signal or the edge detection signal is activated and delay the first selection signal by the predetermined time to generate a second enable signal when the phase monitoring signal and the edge detection signal are deactivated;

a first frequency divider configured to be enabled in response to the first enable signal, and generate the frequency division feedback clock signal by frequency-dividing the feedback clock signal; and a second frequency divider configured to be enabled in response to the second enable signal, and generate the frequency division reference clock signal.

11. A semiconductor memory device, comprising:

a delay locked loop circuit configured to delay an external clock signal to generate an internal clock signal, and generate a feedback clock signal locked to the external clock signal;

a row address decoder configured to decode a row address, and generate a plurality of word line selection signals;

a column address decoder configured to decode a column address, and generate a plurality of column selection signals;

a memory cell array including a plurality of memory cells, wherein the memory cell array is configured to output data stored in memory cells of the plurality of memory cells selected by the plurality of word line selection signals and the plurality of column selection signals;

a data read path unit configured to receive the data output from the memory cell array and output the data in response to the internal clock signal, in response to a read command;

a data output buffer configured to buffer the data output from the data read path unit and output the buffered data; and a data strobe signal buffer configured to buffer the internal clock signal and output a data strobe signal locked to the external clock signal, wherein the delay locked loop circuit comprises:

a clock signal input buffer configured to buffer the external clock signal and generate a reference clock signal;

a coarse delay unit configured to delay the reference clock signal in response to a coarse delay code and a fine delay code to generate an internal clock signal;

a clock signal delay replica unit configured to delay the internal clock signal by a delay time to generate the feedback clock signal;

a coarse delay control unit configured to receive the reference clock signal and the feedback clock signal, detect a transition of the reference clock signal and a transition of the feedback clock signal generated within one clock cycle before the transition of the reference clock signal to generate a frequency division reference clock signal and a frequency division feedback clock signal, and detect a time period between a transition time point of the frequency division reference clock signal and a transition time point of the frequency division feedback clock signal to generate the coarse delay code; and a fine delay control unit configured to compare a phase of the reference clock signal and a phase of the feedback clock signal, and generate the fine delay code.

12. The semiconductor memory device of claim 11, further comprising:

a mode set register configured to receive a mode set code in response to a mode set command to set a read latency and a burst length; and a latency control unit configured to generate a latency signal which is activated when the data is output from the data output buffer using the internal clock signal, the read latency, and the burst length, in response to the read command.

13. The semiconductor memory device of claim 11, wherein the delay unit comprises:

a coarse delay unit configured to delay the reference clock signal in response to the coarse delay code; and a fine delay unit configured to delay a clock signal output from the coarse delay unit in response to the fine delay code to generate the internal clock signal.

14. The semiconductor memory device of claim 11, wherein the coarse delay control unit comprises:
a feedback clock signal preference generator configured to detect a transition time point of the reference clock signal and a transition time point of the feedback clock signal, and generate the frequency division reference clock signal and the frequency division feedback clock signal; and
a coarse delay code generator configured to detect a time period between the transition time point of the frequency division feedback clock signal and the transition time point of the frequency division reference clock signal, and generate the coarse delay code corresponding to the time period.

15. The semiconductor memory device of claim 14, wherein the feedback clock signal preference generator comprises:
a phase monitoring unit configured to detect a level of the reference clock signal at a rising transition of the feedback clock signal to activate a phase monitoring signal;
an edge detector configured to detect a falling transition of the reference clock signal during the rising transition of the feedback clock signal to activate an edge detection signal;
a frequency division edge selector configured to activate a first selection signal in response to the rising transition of the feedback clock signal and use the first selection signal to activate a second selection signal in response to a rising transition of the reference clock signal when the phase monitoring signal or the edge detection signal is activated, and activate the first selection signal in response to a falling transition of the feedback clock signal and use the first selection signal to activate the second selection signal in response to the rising transition of the reference clock signal when the phase monitoring signal and the edge detection signal are deactivated;
a frequency division enable signal generator configured to delay the first selection signal by a first time to generate a first enable signal, and delay the second selection signal by the first time when the phase monitoring signal or the edge detection signal is activated and delay the first selection signal by the first time to generate a second enable signal when the phase monitoring signal and the edge detection signal are deactivated;
a first frequency divider configured to be enabled in response to the first enable signal, and generate the frequency division feedback clock signal by frequency-dividing the feedback clock signal; and
a second frequency divider configured to be enabled in response to the second enable signal, and generate the frequency division reference clock signal by frequency-dividing the reference clock signal.

16. The semiconductor memory device of claim 15, wherein the phase monitoring unit comprises:

a first flip-flop configured to receive the reference clock signal in response to the rising transition of the feedback clock signal to generate the phase monitoring signal.

17. The semiconductor memory device of claim 15, wherein the edge detector comprises:
a first delayer configured to delay the reference clock signal to generate a delayed reference clock signal;
a second delayer configured to delay the feedback clock signal to generate a delayed feedback clock signal;
a second flip-flop configured to receive the delayed reference clock signal in response to the feedback clock signal to generate a first detection signal;
a third flip-flop configured to receive the reference clock signal in response to the delayed feedback clock signal to generate a second detection signal;
a first inverter configured to invert the second detection signal to generate an inverted second detection signal;
a NAND gate configured to perform a NAND operation on the first detection signal and the inverted second detection signal; and
a second inverter configured to invert an output signal of the NAND gate to generate the edge detection signal.

18. The semiconductor memory device of claim 15, wherein the frequency division edge selector comprises:
a NOR gate configured to perform a NOR operation on the phase monitoring signal and the edge detection signal;
an inverter configured to invert an output signal of the NOR gate to generate a third detection signal;
a feedback clock signal phase determination unit configured to generate an intermediate feedback clock signal having the same phase as or an inverted phase of the feedback clock signal in response to the third detection signal;
a fourth flip-flop configured to latch a coarse locking enable signal in response to the intermediate feedback clock signal to generate the first selection signal; and
a fifth flip-flop configured to latch the first selection signal in response to the reference clock signal to generate the second selection signal.

19. The semiconductor memory device of claim 18, wherein the frequency division enable signal generator comprises:
a delayer configured to delay the first selection signal by the first time to generate the first enable signal; and
a selector configured to select the first selection signal or the second selection signal, and delay the selected first selection signal or the selected second selection signal by the first time to generate the second enable signal.

20. The semiconductor memory device of claim 11, wherein the fine delay control unit comprises:
a phase comparator configured to compare a phase of the reference clock signal and a phase of the feedback clock signal and generate an up signal or a down signal according to a result of the comparison, after an operation of the coarse delay control unit is completed; and
a fine delay code generator configured to perform a counting operation in response to the up signal or the down signal to generate the fine delay code.

* * * * *